(12) United States Patent
Yao et al.

(10) Patent No.: US 10,209,558 B2
(45) Date of Patent: Feb. 19, 2019

(54) ARRAY SUBSTRATE AND MANUFACTURING METHOD THEREOF, DISPLAY PANEL AND DISPLAY DEVICE

(71) Applicant: BOE Technology Group Co., Ltd., Beijing (CN)

(72) Inventors: Qi Yao, Beijing (CN); Zhanfeng Cao, Beijing (CN); Feng Zhang, Beijing (CN); Haixu Li, Beijing (CN); Shengguang Ban, Beijing (CN); Yingwei Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/745,062

(22) PCT Filed: Aug. 17, 2017

(86) PCT No.: PCT/CN2017/097746
§ 371 (c)(1),
(2) Date: Jan. 15, 2018

(87) PCT Pub. No.: WO2018/086397
PCT Pub. Date: May 17, 2018

(65) Prior Publication Data
US 2019/0011772 A1    Jan. 10, 2019

(30) Foreign Application Priority Data

Nov. 14, 2016 (CN) .......................... 2016 1 0999719

(51) Int. Cl.
*H01L 51/52* (2006.01)
*G02F 1/1335* (2006.01)
(Continued)

(52) U.S. Cl.
CPC ...... *G02F 1/133528* (2013.01); *G02F 1/1368* (2013.01); *G02F 1/136209* (2013.01);
(Continued)

(58) Field of Classification Search
CPC ............. H01L 27/0214; H01L 51/5293; H01L 51/5296; G02F 1/133528; G01F 1/136209
See application file for complete search history.

(56) References Cited

U.S. PATENT DOCUMENTS

2015/0362770 A1   12/2015  Yang et al.
2018/0292708 A1*  10/2018  Huang .............. G02F 1/133528

FOREIGN PATENT DOCUMENTS

CN     104765192 A    7/2015
CN     104914615 A    9/2015
(Continued)

OTHER PUBLICATIONS

Nov. 1, 2017—International Search Report and Written Opinion Appn PCT/CN2017/097746 with Eng Tran.

*Primary Examiner* — Hoai V Pham
(74) *Attorney, Agent, or Firm* — Banner & Witcoff, Ltd.

(57) ABSTRACT

An array substrate and a manufacturing method thereof, and a display device are provided. The array substrate includes: a base substrate, an active layer, and a first polarization structure. The active layer is disposed on the base substrate; the first polarization structure is disposed on a side of the active layer facing the base substrate, and an orthographic projection of the first polarization structure on the base substrate is at least partially overlapped with an orthographic projection of the active layer on the base substrate.

20 Claims, 5 Drawing Sheets

(51) Int. Cl.
*H01L 27/12* (2006.01)
*G02F 1/1362* (2006.01)
*H01L 21/02* (2006.01)
*H01L 21/3065* (2006.01)
H01L 29/786 (2006.01)
G02F 1/1368 (2006.01)
H01L 21/3213 (2006.01)
H01L 29/66 (2006.01)

(52) U.S. Cl.
CPC .. *G02F 1/136227* (2013.01); *H01L 21/02532* (2013.01); *H01L 21/02592* (2013.01); *H01L 21/02667* (2013.01); *H01L 21/3065* (2013.01); *H01L 27/1218* (2013.01); *H01L 27/1262* (2013.01); *H01L 27/1274* (2013.01); *H01L 27/1288* (2013.01); *H01L 29/78633* (2013.01); G02F 2001/13685 (2013.01); G02F 2001/133531 (2013.01); G02F 2001/133567 (2013.01); G02F 2202/104 (2013.01); H01L 21/32134 (2013.01); H01L 21/32139 (2013.01); H01L 27/1222 (2013.01); H01L 29/66757 (2013.01); H01L 29/78675 (2013.01)

(56) References Cited

FOREIGN PATENT DOCUMENTS

| | | | |
|---|---|---|---|
| CN | 104991373 A | 10/2015 | |
| CN | 105739158 A | 7/2016 | |

* cited by examiner

ARRAY SUBSTRATE AND MANUFACTURING METHOD THEREOF, DISPLAY PANEL AND DISPLAY DEVICE

The application is a U.S. National Phase Entry of International Application No. PCT/CN2017/097746 filed on Aug. 17, 2017, designating the United States of America and claiming priority to Chinese Patent Application No. 201610999719.X, filed Nov. 14, 2016. The present application claims priority to and the benefit of the above-identified applications and the above-identified applications are incorporated by reference herein in their entirety.

TECHNICAL FIELD

At least one embodiment of the present disclosure relates to an array substrate and a manufacturing method thereof, a display panel and a display device.

BACKGROUND

Existing products, which take the n-type metal oxide semiconductor (nMOS) low temperature polysilicon-liquid crystal display (LTPS-LCD) as an example, are usually manufactured by adopting 9 patterning processes. Generally, before an active layer is formed, a light shield layer is formed on a base substrate by using a metal material such as molybdenum. In prior art, the light shield layer is formed by patterning a metal layer which is formed on an entire surface of the base substrate. However, forming the metal layer on the entire surface of the base substrate may easily cause an abnormal discharge phenomenon.

SUMMARY

At least one embodiment of the disclosure provides an array substrate and a manufacturing method thereof, a display panel and a display device.

At least one embodiment of the disclosure provides an array substrate. The array substrate comprises: a base substrate, an active layer, and a first polarization structure. The active layer is disposed on the base substrate; the first polarization structure is disposed on a side of the active layer facing the base substrate, and an orthographic projection of the first polarization structure on the base substrate is at least partially overlapped with an orthographic projection of the active layer on the base substrate.

For example, in the array substrate provided by an example of the embodiment of the disclosure, the first polarization structure is provided between the base substrate and the active layer.

For example, in the array substrate provided by an example of the embodiment of the disclosure, the orthographic projection of the active layer on the base substrate falls within the orthographic projection of the first polarization structure on the base substrate.

For example, in the array substrate provided by an example of the embodiment of the disclosure, the orthographic projection of the active layer on the base substrate substantially coincides with the orthographic projection of the first polarization structure on the base substrate.

For example, in the array substrate provided by an example of the embodiment of the disclosure, a thickness of the first polarization structure is 50 Å-100 Å.

For example, in the array substrate provided by an example of the embodiment of the disclosure, the array substrate further comprises a second polarization structure. The second polarization structure is laminated on the base substrate, and disposed on the side of the active layer facing the base substrate, wherein a polarization direction of the first polarization structure is substantially perpendicular to a polarization direction of the second polarization structure, and both of the orthographic projections of the active layer and the first polarization structure on the base substrate fall within an orthographic projection of the second polarization structure on the base substrate.

For example, in the array substrate provided by an example of the embodiment of the disclosure, the second polarization structure is provided between the base substrate and the active layer.

For example, in the array substrate provided by an example of the embodiment of the disclosure, the second polarization structure has a nano-sized grating pattern.

For example, in the array substrate provided by an example of the embodiment of the disclosure, a material of the first polarization structure comprises metal or resin containing conductive material.

For example, in the array substrate provided by an example of the embodiment of the disclosure, the first polarization structure has a nano-sized grating pattern.

For example, in the array substrate provided by an example of the embodiment of the disclosure, the array substrate further comprises a buffer layer. The buffer layer is disposed between the first polarization structure and the active layer.

At least one embodiment of the disclosure provides a manufacturing method of an array substrate, comprising forming a polarization layer on a base substrate; forming a semiconductor layer on the base substrate; patterning the polarization layer and the semiconductor layer, the patterned semiconductor layer forming an active layer, the patterned polarization layer forming a first polarization structure, and an orthographic projection of the first polarization structure on the base substrate being at least partially overlapped with an orthographic projection of the active layer on the base substrate.

For example, in the manufacturing method of the array substrate provided by an example of the embodiment of the disclosure, the semiconductor is formed on a side of the polarization layer far away from the base substrate.

For example, in the manufacturing method of the array substrate provided by an example of the embodiment of the disclosure, the polarization layer and the semiconductor layer are patterned by one patterning process.

For example, in the manufacturing method of the array substrate provided by an example of the embodiment of the disclosure, a thickness of the first polarization structure is 50 Å-100 Å.

For example, in the manufacturing method of the array substrate provided by an example of the embodiment of the disclosure, a material of the first polarization structure comprises metal or resin containing conductive material.

For example, in the manufacturing method of the array substrate provided by an example of the embodiment of the disclosure, the first polarization structure has a nano-sized grating pattern.

For example, in the manufacturing method of the array substrate provided by an example of the embodiment of the disclosure, the first polarization structure having the nano-sized grating pattern is formed by a nano-imprinting method.

For example, in the manufacturing method of the array substrate provided by an example of the embodiment of the disclosure, the method further comprises forming a buffer layer between the first polarization structure and the active layer, wherein the buffer layer and at least one of the active layer and the first polarization layer are patterned by one patterning process.

For example, in the manufacturing method of the array substrate provided by an example of the embodiment of the disclosure, the method further comprises forming a second polarization structure on a side of the active layer facing the base substrate, wherein a polarization direction of the first polarization structure is substantially perpendicular to a polarization direction of the second polarization structure, and both of the orthographic projections of the active layer and the first polarization structure on the base substrate fall within an orthographic projection of the second polarization structure on the base substrate.

For example, in the manufacturing method of the array substrate provided by an example of the embodiment of the disclosure, the second polarization structure is formed between the active layer and the base substrate.

For example, in the manufacturing method of the array substrate provided by an example of the embodiment of the disclosure, the second polarization is formed by the nano-imprinting method, and the second polarization structure has a nano-sized grating pattern.

At least one embodiment of the disclosure provides a display panel. The display panel comprises the array substrate of above mentioned examples which do not comprise a second polarization structure and the second polarization structure provided on a side of a base substrate far away from an active layer, wherein a polarization direction of a first polarization structure is substantially perpendicular to a polarization direction of the second polarization structure, and both of orthographic projections of the active layer and the first polarization structure on the base substrate fall within an orthographic projection of the second polarization structure on the base substrate.

At least one embodiment of the disclosure provides a display panel comprising the above mentioned array substrate comprising the second polarization structure.

At least one embodiment of the disclosure provides a display device comprising any one of the above mentioned array substrates.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE SIGNS

101—base substrate; 102—active layer; 1021—semiconductor layer; 103—second polarization structure; 104—first polarization structure; 1041—polarization layer; 105—buffer layer; 106—insulation layer; 110—gate insulation layer; 111—gate electrode; 112—contact hole; 1131—source electrode; 1132—drain electrode; 114—planarization layer; 1141—via hole; 1142—via hole; 115—common electrode; 116—passivation layer; 117—pixel electrode; 118—common electrode line; 119—interlayer insulation layer.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to limit to a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
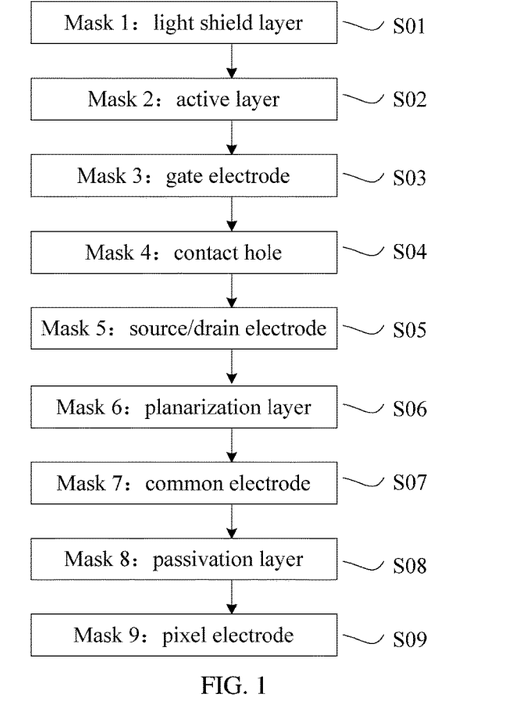
FIG. 1 is a flow chart of a patterning process in a manufacturing process of an array substrate.

FIG. 1 is a flow chart of patterning processes in a manufacturing process of an array substrate. As illustrated in FIG. 1, a n-type metal oxide semiconductor (nMOS) low temperature polysilicon-liquid crystal display (LTPS-LCD), which is illustrated as an example, comprises a base substrate, a light shield layer, a buffer layer, an active layer, a gate insulation layer, a gate electrode, an interlayer insulation layer, source/drain electrodes, a planarization layer, a common electrode, a passivation layer and a pixel electrode. In order to fabricate the array substrate, 9 masks are usually required to perform 9 patterning processes as follows.

S01: forming the light shield layer by a patterning process with a light shield mask (Mask 1);

S02: forming the active layer by etching the semiconductor layer by a patterning process with an active layer mask (Mask 2);

S03: forming the gate electrode by a patterning process with a gate electrode mask (Mask 3);

S04: forming a contact hole for connecting the source/drain electrodes with the active layer by a patterning process with a contact hole mask (Mask 4);

S05: forming the source/drain electrodes by a patterning process with a source-drain electrode mask (Mask 5);

S06: forming a via hole for exposing the drain electrode and a common electrode line by processing the planarization layer by a patterning process with a planarization layer mask (Mask 6);

S07: forming the common electrode by a patterning process with a common electrode mask (Mask 7);

S08: forming a via hole for exposing the drain electrode by processing the passivation layer by a patterning process with a passivation layer mask (Mask 8);

S09: forming the pixel electrode by a patterning process with a pixel electrode mask (Mask 9), so that the pixel electrode is electrically connected with the drain electrode.

In S01, the light shield layer is formed by a patterning process with the light shield layer mask (Mask 1). On one hand, the light shield layer is formed on an entire surface of the base substrate by using a metal material such as molybdenum, which easily causes the abnormal discharge phenomenon. Furthermore, each of different products requires a mask, a large area of the light shield layer is etched to be patterned by a wet etching method, a size of the etched light shield layer is generally larger than that of the active layer to be formed, and the light shield layer and the active layer are difficult to be patterned simultaneously. On the other hand, a thickness and a slope angle of the light shield layer will influence on the effect of subsequently crystallizing the active layer.

At least one embodiment of the disclosure provides an array substrate. The array substrate comprises a base substrate, an active layer and a first polarization structure. The active layer is provided on the base substrate, the first polarization structure is provided on a side of the active layer facing the base substrate, and an orthographic projection of the first polarization structure on the base substrate is at least partially overlapped with an orthographic projection of the active layer on the base substrate. When the array substrate provided by the embodiment is applied to a liquid crystal display panel, for example, a polarization direction of the first polarization structure of the array substrate is substantially perpendicular to a polarization direction of a polarization plate of the liquid-crystal display panel, to ensure the first polarization structure in combination with the polarization plate can have the light shield effect, so that no light from a backlight on a side of the active layer close to the array substrate is incident on the active layer, to avoid that the active layer is irradiated by the backlight to generate the photogenerated leakage current. The embodiment adopts the first polarization structure to replace the conventional metal light shield layer, which can effectively avoid the first polarization structure having the light shield function to cause the abnormal discharge phenomenon. The polarization direction of the first polarization structure is substantially perpendicular to the polarization direction of the polarization plate. The "substantially perpendicular to" herein refers to strictly perpendicular to or approximately perpendicular to, which ensures the first polarization structure in combination with the polarization plate can have the light shield effect.

At least one embodiment of the disclosure provides a manufacturing method of an array substrate, comprising: forming a polarization layer on a base substrate; forming a semiconductor layer on the base substrate; patterning the polarization layer and the semiconductor layer, the patterned semiconductor layer forming an active layer, the patterned polarization layer forming a first polarization structure, and an orthographic projection of the first polarization structure on the base substrate being at least partially overlapped with an orthographic projection of the active layer on the base substrate. In the manufacturing method of the array substrate, because the first polarization structure is formed by using the polarization layer, a thickness of the formed first polarization structure is small, which can avoid the badness of subsequent crystallizing the active layer formed on the first polarization layer resulting from the thickness and the slop angle of the first polarization structure.

At least one embodiment of the disclosure provides a display device, comprising any one of the above mentioned array substrates. The display device, which adopts the above mentioned array substrate, can avoid the photogenerated leakage current upon the active layer being irradiated by the backlight, so as to enhance the yield rate.

At least one embodiment of the disclosure provides a display panel.

An array substrate and a manufacturing method thereof, a display panel and a display device are explained below by following several embodiments.

First Embodiment

Figure 2A:
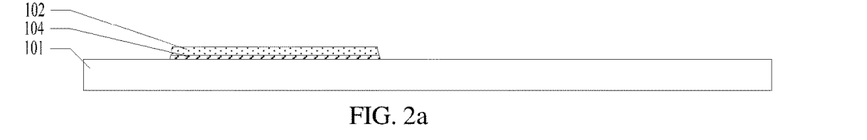
FIG. 2a is a schematic diagram of an array substrate provided by an example of an embodiment of the disclosure.

The embodiment of the disclosure provides an array substrate. FIG. 2a is a schematic diagram of an example of an embodiment of the disclosure. As illustrated in FIG. 2a, the array substrate comprises: a substrate 101, an active layer 102 and a first polarization structure 104. The active layer 102 is provided on the base substrate 101; the first polarization structure 104 is provided on a side of the active layer 102 facing the base substrate 101, and an orthographic projection of the first polarization structure 104 on the base substrate 101 is at least partially overlapped with an orthographic projection of the active layer 102 on the substrate 101.

It should be noted that, the first polarization structure being provided on the side of the active layer facing the base substrate can comprises: the first polarization structure is provided between the active layer and the base substrate, or the first polarization structure is provided on a side of the substrate far away from the active layer. The example in which the first polarization structure is provided between the base substrate and the active layer is illustrated for description.

Figure 2B:
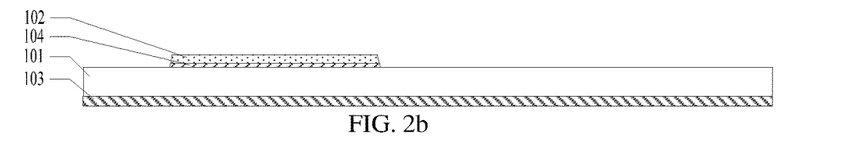
FIG. 2b is a schematic diagram of an array substrate provided by another example of an embodiment of the disclosure.

For example, FIG. 2b is a schematic diagram of an array substrate provided by another example of the embodiment of the disclosure. As illustrated in FIG. 2b, a second polarization structure 103 is provide on a side of the active layer 102 facing the base substrate 101, a polarization direction of the first polarization structure 104 is substantially perpendicular to a polarization direction of the second polarization structure 103, both of an orthographic projection of the active layer 102 and an orthographic projection of the first polarization structure 104 on the base substrate 101 fall within an orthographic projection of the second polarization structure 103 on the base substrate 101.

For example, the polarization direction of the first polarization structure 104 on the side of the base substrate 101 facing the active layer 102 is substantially perpendicular to the polarization direction of the second polarization structure 103 on the side of the base substrate 101 far away from the first polarization structure 104. When a light source irradiates from a side of the second polarization structure 103 far away from the base substrate 101, the second polarization structure 103 absorbs the light in a direction substantially perpendicular to the transmission axis thereof, and thus, the light emitted from the second polarization structure 103 is linear polarization light having a polarization direction the same as the polarization direction of the second polarization structure 103. When the linear polarization light is incident on the first polarization structure 104 through the base substrate 101, because the polarization direction of the first polarization structure 104 is substantially perpendicular to the polarization direction of the second polarization structure 103, the polarization direction of the linear polarization light is substantially perpendicular to the polarization direction of the first polarization structure 104 and the linear polarization light cannot pass through the first polarization structure 104. Therefore, the first polarization structure 104 in cooperation with the second polarization structure 103 have a good light shield effect, and no light from the backlight on the side of the second polarization structure 103 far away from the base substrate 101 is incident on the active layer 102, so as to avoid the photo-generated leakage current upon the active layer 102 being irradiated by the backlight, and improve the display quality. It should be noted that, the embodiment illustrates the liquid-crystal display panel as an example, and is not limited to this.

For example, as illustrated in FIG. 2b, the orthographic projection of the active layer 102 on the base substrate 101 falls within the orthographic projection of the first polarization structure 104 on the base substrate 101, and both of the orthographic projection of the active layer 102 and the orthographic projection of the first polarization structure 104 on the base substrate 101 fall within the orthographic projection of the second polarization structure 103 on the base substrate 101. For example, the orthographic projection of the active layer 102 on the base substrate 101 completely coincides with the orthographic projection of the first polarization structure 104 on the base substrate 101. As illustrated in FIG. 2b, the shape and the size of the pattern of the first polarization structure is the same as those of the pattern of the active layer 102, and the first polarization structure and the active layer 102 are overlapped with each other. That is, the first polarization structure 104 and the active layer 102 can be formed by one patterning process to have the pattern with the same shape and size. Compared to the conventional patterning process, the first polarization structure 104 and the active layer 102 are formed by the one patterning process, which can effectively reduce a step of separately patterning the first polarization structure, save the cost and improve the yield rate.

For example, when the backlight irradiates the second polarization structure 103, the light parallel to the transmission axis of the second polarization structure 103 can pass therethrough, and thus the light emitted from the second polarization structure 103 is the linear polarization light having a polarization direction the same as the polarization direction of the second polarization structure 103. When the linear polarization light is incident on the first polarization structure 104, because the polarization direction of the first polarization structure 104 is substantially perpendicular to the polarization direction of the second polarization structure 103, the polarization direction of the linear polarization light is substantially perpendicular to the polarization direction of the first polarization structure 104, and the linear polarization light cannot pass through the first polarization structure 104. Therefore, the first polarization structure 104 in cooperation with the second polarization structure 103 can shield the light incident on the active layer 104. In order to achieve the good light shield effect, the light shield layer which uses the opacity of the material of the light shield layer for blocking the light usually has a thickness of several hundred to several thousand angstroms (Å). Such a thick light shield layer will generate a certain slope angle during the patterning process, which influences the effect of subsequently crystalizing the active layer. But a thickness of the first polarization structure 104 having the polarization characteristic of the embodiment is 50-100 Å, for example. Compared to the conventional light shield layer, the thickness influence is reduced and the generation of the slope angle is avoided, so as to ensure the effect of subsequently crystallizing the active layer.

For example, a material of the first polarization structure 104 comprises for example metal or resin containing conductive material. The material of the first polarization structure 104 can be the same as the metal material of the conventional light shield layer, comprising molybdenum, aluminium, chromium or silver, etc., and can also be a resin layer containing the conductive material. The conductive material can be nanoscale metal wires, comprising silver wires, aluminum wires, etc., or additives of metal powders etc. . . . . The material of the first polarization structure 104 is not limited by the embodiment, and it can be a nanoscale transparent or opaque non-conductive material.

For example, the first polarization structure 104 can have a nanoscale grating pattern which can be made by the nano-imprinting method or the laser-direct-structuring method etc., and the embodiment is not limited to this. A period of the grating pattern of the first polarization structure 104 can be 60 nm-300 nm. For example, the grating pattern of the first polarization structure 104 is slits which are arranged in parallel. The light substantially perpendicular to an extending direction of the slits can transmit and the polarization direction of the linear polarization light emitted from the second polarization structure 103 is substantially parallel to the extending direction of the slits of the grating pattern in the polarization layer 104, and thus it cannot pass through the first polarization structure 104. Therefore, the first polarization structure 104 in cooperation with the second polarization structure 103 is used to shield the light incident on the active layer 102.

For example, the second polarization structure 103 can also have a nanoscale grating pattern, which can be made by the nano-imprinting method or the laser-direct-structuring method etc., and the embodiment is not limited to this. For example, the second polarization structure 103 can be a metal wire grating structure. The second polarization structure 103 which adopts the metal wire grating structure can substitute the polarization plate of the liquid-crystal display panel, which can not only decrease the thickness of the display panel, but also save a process of attaching the polarization plate for manufacturing the display panel.

Figure 2C:
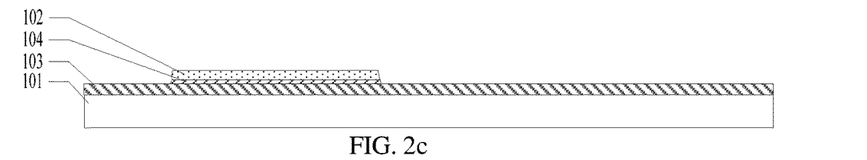
FIG. 2c is a schematic diagram of an array substrate provided by another example of an embodiment of the disclosure.

In the above mentioned embodiment, the second polarization structure 103 is provided on the side of the base substrate 101 far away from the active layer 102, but the embodiments of the disclosure are not limited to this. FIG. 2c is a schematic diagram of an array substrate of another example provided by the embodiment of the disclosure. For example, as illustrated in FIG. 2c, the second polarization structure 103 is provided between the base substrate 101 and the active layer 102. The embodiment is not limited to this, and the second polarization structure 103 and the active layer 102 can be provided on the same side of the base substrate 101, provided that both of the second polarization structure 103 and the first polarization structure 104 are provided on a side of the active layer 102 close to the base substrate 101. For example, in a direction perpendicular to the base substrate 101, the first polarization structure 104 and the second polarization structure 103 are provided between the active layer 102 and the base substrate 101, and a sequence of the first polarization structure 104 and the second polarization structure 103 in the direction can be changed. For example, in the example, the second polarization structure provided between the base substrate and the active layer can have a nanoscale grating pattern, and can be made by the nano-imprinting method or the laser-direct-structuring method etc. For example, the second polarization structure 103 can be a metal wire grating structure. The second polarization structure adopts the metal wire grating structure and is provided within the array substrate can substitute the polarization plate of the liquid-crystal display panel, which can not only decrease the thickness of the display panel, but also save a process of attaching the polarization plate for manufacturing the display panel. It should be noted that, when the second polarization structure is the metal nano-structure, an insulation layer should be provided between the first polarization structure and the second polarization structure.

In these structures, because the polarization direction of the first polarization structure 104 is substantially perpendicular to the polarization direction of the second polarization structure 103, the first polarization structure 104 in combination with the second polarization structure 103 can have the light shield function. For example, in these structures, the second polarization structure 103 can also be formed as a polarization film.

Second Embodiment

Figure 2D:
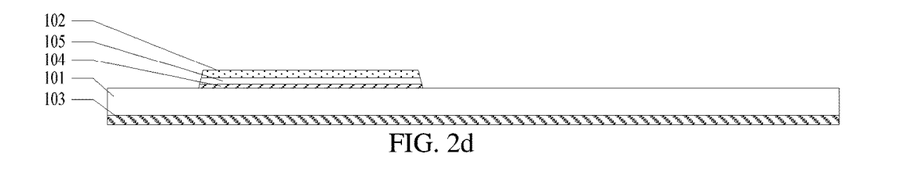
FIG. 2d is a schematic diagram of an array substrate provided by another embodiment of the disclosure.

The embodiment provides an array substrate. As illustrated in FIG. 2d, the array substrate further comprises a buffer layer 105 in addition to the same portion of the first embodiment. That is, it is different from FIG. 2b in that the buffer layer 105 is provided between the first polarization structure 104 and the active layer 102. The buffer layer can have a material of oxide, nitride, oxynitride, and the like. It should be noted that, the embodiment illustrates an example in which the polarization structure is provided between the substrate and the active layer, for description. As illustrate in FIG. 2d, the shape and the size of the buffer layer 105 is the same as those of the first polarization structure 104 and the active layer 102, i.e. the buffer layer 105 as well as the first polarization structure 104 and the active layer 102 can be formed by a patterning process to have the pattern with the same shape and size. For example, the buffer layer 105 is an insulation buffer layer. On one hand, the active layer 102 and the first polarization structure 104 can be insulated; on the other hand, the effect of subsequently crystallizing the active layer 102 formed on the buffer layer 105 can be better.

For example, the second polarization structure 103 may not be included in the array substrate of the embodiment, or the second polarization structure 103 of the embodiment can also be provided as illustrated in FIG. 2c.

Third Embodiment

Figure 3:
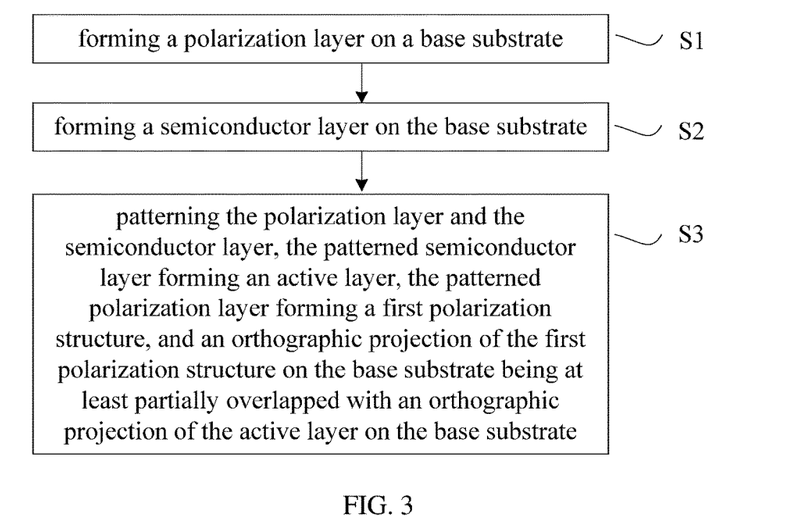
FIG. 3 is a schematic diagram of a manufacturing method of an array substrate provided by an embodiment of the disclosure.

The embodiment provides a manufacturing method of an array substrate, as illustrated in FIG. 3, comprising following steps.

S1: forming a polarization layer on a base substrate;
S2: forming a semiconductor layer on the base substrate;
S3: patterning the polarization layer and the semiconductor layer, the patterned semiconductor layer forming an active layer, the patterned polarization layer forming a first polarization structure, and an orthographic projection of the first polarization structure on the base substrate being at least partially overlapped with an orthographic projection of the active layer on the base substrate.

For example, the semiconductor layer is formed on a side of the polarization layer far away from the base substrate, but the embodiments include but are not limited to this. For example, the semiconductor layer can also be formed on a side of the base substrate far away from the polarization layer, but the embodiment illustrates an example in which the semiconductor layer is formed on the side of the polarization layer far away from the base substrate, for description.

For example, the manufacturing method of the array substrate provided by the embodiment can utilize one patterning process to pattern the polarization layer and the semiconductor layer, the patterned polarization layer forms the first polarization structure, and the patterned semiconductor layer forms the active layer. Therefore, compared to the conventional patterning process, the embodiment saves a step of separately patterning the polarization layer to form the first polarization structure. The embodiment is not limited to this and the polarization layer and the semiconductor layer can be patterned respectively.

Figure 4:
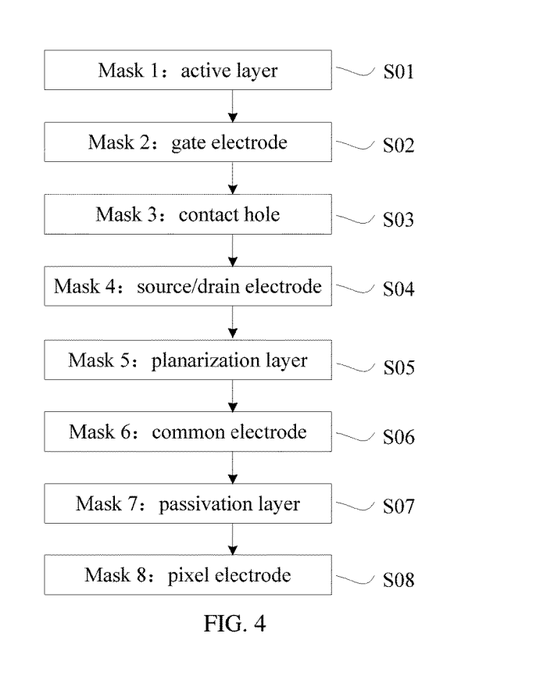
FIG. 4 is a flow chart of patterning processes of a manufacturing process of an array substrate provided by an embodiment of the disclosure.

As illustrated in FIG. 4, the embodiment achieves 8 patterning processes, without a mask for making the first polarization structure, which can save the cost and improve the yield rate.

S01: patterning the polarization layer and the semiconductor layer by one patterning process with an active layer mask (Mask 1), the patterned polarization layer forming the first polarization structure, and the patterned semiconductor layer forming the active layer;

S02: forming a gate electrode by a patterning process with a gate electrode mask (Mask 2);

S03: forming a contact hole for connecting source/drain electrodes with the active layer by etching an interlayer insulation layer and a gate insulation layer by a patterning process with a contact hole mask (Mask 3);

S04: forming the source/drain electrodes on the contact hole by a patterning process with a source-drain electrode mask (Mask 4);

S05: forming a via hole for exposing the drain electrode and a common electrode line by processing a planarization layer by a patterning process with a planarization mask (Mask 5);

S06: forming a common electrode by a patterning process with a common electrode mask (Mask 6);

S07: forming a via hole for exposing the drain electrode by processing a passivation layer by a patterning process with a passivation layer mask (Mask 7);

S08: forming a pixel electrode by a patterning process with a pixel electrode mask (Mask 8), so that the pixel electrode is electrically connected with the drain electrode.

Figure 5A:
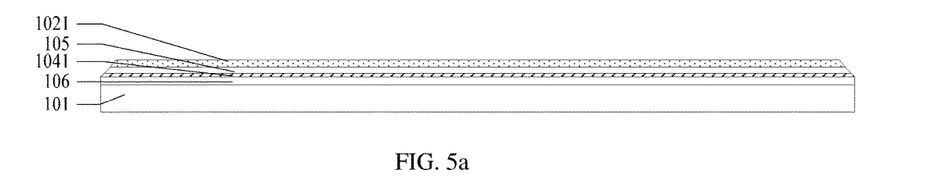
FIGS. 5a-5j are cross-sectional views of an array substrate after completing each of the patterning processes provided by the embodiment of the disclosure.

FIGS. 5a-5j illustrate schematic diagrams of various stages of manufacturing processes. As illustrated in FIG. 5a, an insulation layer 106, a polarization layer 1041, a buffer layer 105 and a semiconductor layer 1021 are formed in sequence on a base substrate 101. For example, the base substrate 101 can be made of one or more selected from the group consisting of glass, polyimide, polycarbonate, polyacrylate, polyetherimide, polyethersulfone, polyethylene terephthalate, and polyethylene naphthalate. The polarization layer 1041 is a polarization layer formed on an entire surface of the base substrate 101.

For example, a grating pattern is formed on the polarization layer 1041 by using the nano-imprinting method. For example, the nano-imprinting method transfers a pattern to a corresponding substrate by a template. The transfer medium is usually a very thin polymer film, and the structure of the transfer medium is cured to remain the transferred pattern by a method of heat pressing or irradiating etc. . . . . The nano-imprinting template is made in advance from the a grating pattern having slits arranged in parallel which are required by the polarization, and the template can be made of quartz, glass or plastic etc. . . . . The embodiment is not limited to the nano-imprinting method, and can also adopt the laser-direct-structuring method etc. . . . . . For example, the grating pattern of the polarization layer 1071 is the slits arranged in parallel, and the light substantially perpendicular to an extending direction of the slits can transmit.

For example, forming the semiconductor 1021 on the polarization layer 1041 comprises: depositing an amorphous silicon layer on the polarization layer 104 and crystallizing the amorphous silicon layer to form a polycrystalline silicon layer by the excimer laser annealing method. The semiconductor layer 1021 of the embodiment is a polycrystalline silicon layer. Crystallizing the amorphous silicon layer to form the polycrystalline silicon layer can also adopt the metal-induced crystallizing process, the selective laser sintering process and the sequential lateral solidifying process etc., and the embodiment is not limited thereto. For example, the embodiments of the disclosure can further comprise an oxide semiconductor active layer and the like.

Figure 5B:
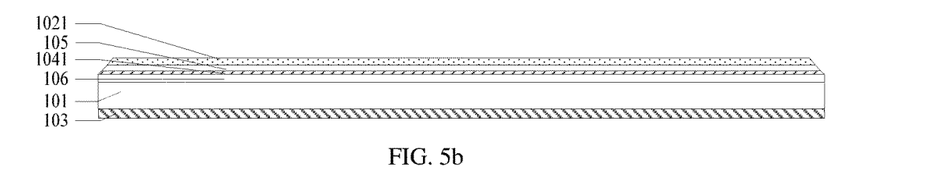

For example, FIG. 5b is a schematic diagram of a forming stage of the array substrate provided by another example of the embodiment. As illustrated in FIG. 5b, it is different from FIG. 5a in that, a second polarization structure 103 can be formed in the side of the base substrate 101 far away from the polarization layer 1041, and the polarization direction of the second polarization structure 103 is substantially perpendicular to the polarization direction of the polarization layer 1041. The direction of the linear polarization light emitted from the second polarization structure 103 is substantially parallel to the extending direction of the slits of the grating pattern in the polarization layer 1041, and thus it cannot pass through the first polarization layer 1041. Therefore, the polarization layer in cooperation with the second polarization structure 103 have a good light shield effect, no light from a backlight on a side of the second polarization structure 103 far away from the base substrate 101 is incident on the active layer 102, so as to avoid the active layer 102 being irradiated by the backlight. It should be noted that, the embodiment illustrates the liquid-crystal display panel as an example, and it is not limited to this.

For example, the second polarization structure can be attached to a side of the base substrate, and the second polarization structure having a nanoscale grating pattern can also be formed on a side of the base substrate by the nano-imprinting method etc. . . . . FIG. 5b illustrates an example in which the second polarization structure is formed on the side of the base substrate far away from the polarization layer, and it is not limited to this. For example, the second polarization structure and the polarization layer can be formed on a same side of the base substrate, the second polarization structure is formed between the active layer and the base substrate, and a sequence of the polarization layer and the second polarization structure 103 in the direction can be changed. When the second polarization structure and the polarization layer are formed on a same side of the base substrate, and are made of metal materials, an insulation layer is required to form between the second polarization structure and the polarization layer. Because the polarization direction of the polarization layer is substantially perpendicular to the polarization direction of the second polarization structure, the polarization layer in cooperation with the second polarization structure can have the light shield function.

Figure 5C:
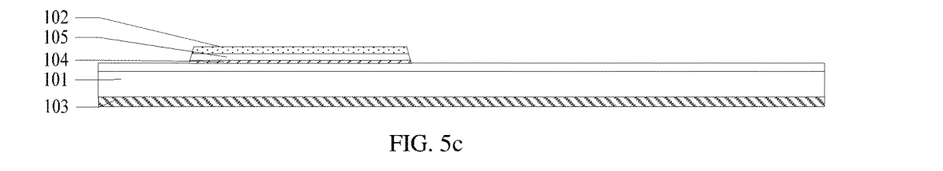

FIGS. 5c-5j are schematic diagrams of an example in which the array substrate comprises the second polarization structure, and the second polarization structure is positioned on the side of the base substrate far away from the polarization layer, but it is not limited to this. For example, the array substrate may not comprise the second polarization structure, or the second polarization structure is positioned on a side of the base substrate facing the polarization layer. As illustrated in FIG. 5c, the semiconductor layer 1021 and the polarization layer 1041 are patterned by using the active layer mask (Mask 1). For example, the active layer 102 and the first polarization structure 104 are formed by one patterning process by the dry etching method, i.e., when the semiconductor layer 1021 is patterned, a portion of the polarization layer 1041 under the active layer 102 which is formed by etching the semiconductor layer is remained, a portion of the polarization layer 1041 where the polarization layer 1041 is exposed is etched, and thus the first polarization structure 104 is formed by the remained portion of the polarization layer 1041. The etching method of the embodiment is not limited to this, and a high precision etching method, such as the laser etching etc., can also be adopted.

For example, a material of the first polarization structure 104 comprises for example metal or resin containing conductive material. The material of the first polarization structure 104 can be the same as the metal material of the conventional light shield layer, comprising molybdenum, aluminium, chromium or silver, etc., and can also be a resin layer containing the conductive material. The conductive material can be nanoscale metal wires, comprising silver wires, aluminum wires, etc., or additives of metal powders etc. . . . . The material of the first polarization structure 104 is not limited by the embodiment, and it can be a nanoscale transparent or opaque non-conductive material.

For example, the first polarization structure 104 is formed for example by the nano-imprinting method. For example, the grating pattern of the first polarization structure 104 is slits which are arranged in parallel. The light substantially perpendicular to an extending direction of the slits can transmit and the direction of the linear polarization light emitted from the second polarization structure 103 is substantially parallel to the extending direction of the slits of the grating pattern in the polarization layer 1041. Therefore, the first polarization structure 104 in cooperation with the second polarization structure 103 is used to shield the light incident on the active layer 102.

For example, the manufacturing method of the array substrate provided by the embodiment further comprises: forming a buffer layer 105 between the first polarization layer 104 and the active layer 102. The buffer layer 105 and at least one of the active layer 102 and the first polarization structure 104 are patterned by one patterning process. As illustrated in FIG. 5c, the embodiment illustrates an example in which the a shape and a size of the buffer layer 105 is the same as those of the first polarization structure 104 and the active layer 102, for description. That is, the buffer layer 105 as well as the first polarization structure 104 and the active layer 102 can be formed by one patterning process to have the pattern with the same shape and size. The buffer layer can have a material of oxide, nitride, oxynitride, and the like. On one hand, the buffer layer 105 can insulate the active layer 102 from the first polarization structure 104; on the other hand, can have better effect on subsequently crystalizing the active layer 102 formed on the buffer layer 105.

Figure 5D:
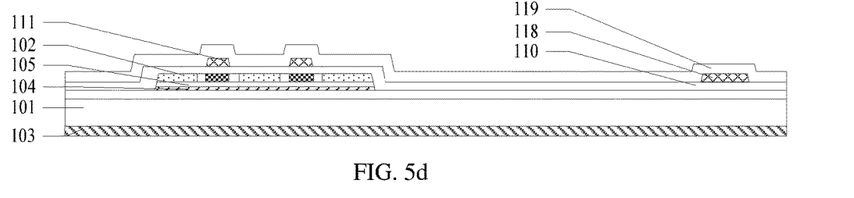

As illustrated in FIG. 5d, a conductive layer formed on a gate insulation layer 110 is patterned to form a gate electrode 111 and a common electrode line 118 by a patterning process with the gate electrode mask (Mask 2), and then an interlayer insulation layer 119 is formed. The gate insulation layer 110 and the interlayer insulation layer 119 can have a material of oxide, nitride, oxynitride, and the like, and the gate electrode 111 can have a material of one or more selected from the group consisting of aluminium, copper, chromium, molybdenum, titanium, or an alloy of combination thereof, and the embodiment is not limited to this. The gate electrode structure is a dual-gate electrode type transistor, but it is not limited to this. It can also be a single-gate electrode type transistor. In addition, in the embodiment, a top-gate electrode type transistor is illustrated as an example. The first polarization structure 104 is cooperated with the second polarization structure 103, to shade the active layer 102 on a side of the gate electrode 111 close to the base substrate 101, and thus, after a liquid-crystal cell is formed subsequently, no light from a backlight on a side of the active layer 102 close to the array substrate 101 is incident on the active layer 102, to avoid that the active layer 102 is irradiated by the backlight to generate the photogenerated leakage current. But the disclosure is not limited to this, and the transistor can also be a bottom-gate type transistor.

Figure 5E:
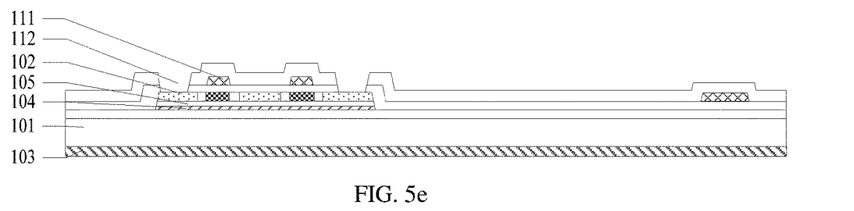

As illustrated in FIG. 5e, a contact hole 112 for connecting a source electrode 1131 and a drain electrode 1132 with the active layer 102 is formed by etching the interlayer insulation layer 119 and the gate insulation layer 110 by a patterning process with the contact hole mask (Mask 3).

Figure 5F:
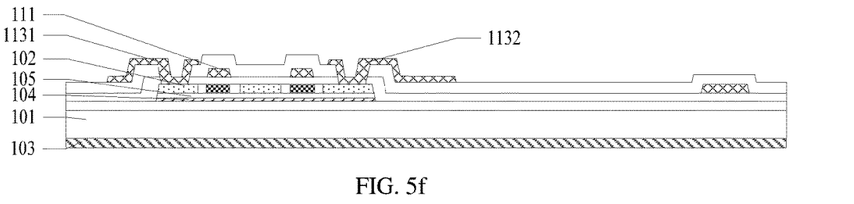

As illustrated in FIG. 5f, the source/drain electrodes are formed on the contact hole by a patterning process with the source-drain electrode mask (Mask 4). One or more of aluminium, copper, chromium, molybdenum, titanium, or an alloy of combination thereof can be selected as a material of the source electrode 1131 and the drain electrode 1132, but the embodiment is not limited to this.

Figure 5G:
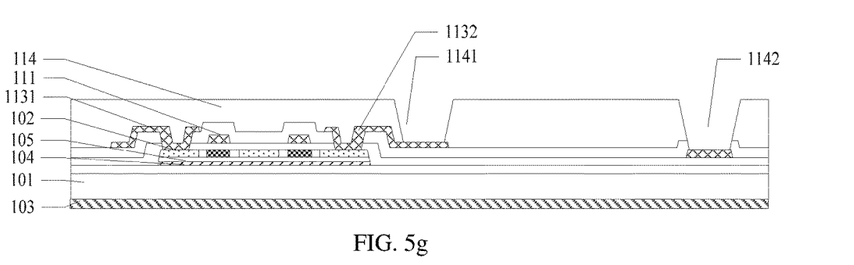

As illustrated in FIG. 5g, via holes 1141 and 1142 for exposing the drain electrode 1132 and the common electrode line 118 are formed by processing a planarization layer 114 by a patterning process with the planarization layer mask (Mask 5), the exposed drain 1132 is electrically connected with the pixel electrode 117 to be formed, and the exposed common electrode line 118 is electrically connected with the common electrode 115 to be formed. A material of the planarization layer 114 can be an organic material, for example, polyimide and the like, but the embodiment is not limited to this.

Figure 5H:
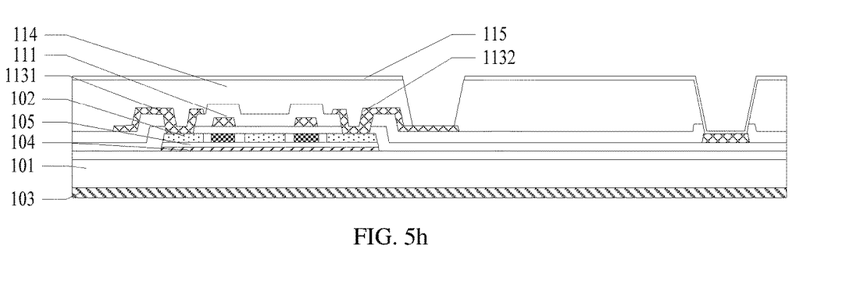

As illustrated in FIG. 5h, the common electrode 115 is formed by a patterning process on an indium tin oxide layer with the common electrode mask (Mask 6), and an material of the common electrode 115 is not limited to the indium tin oxide.

Figure 5I:
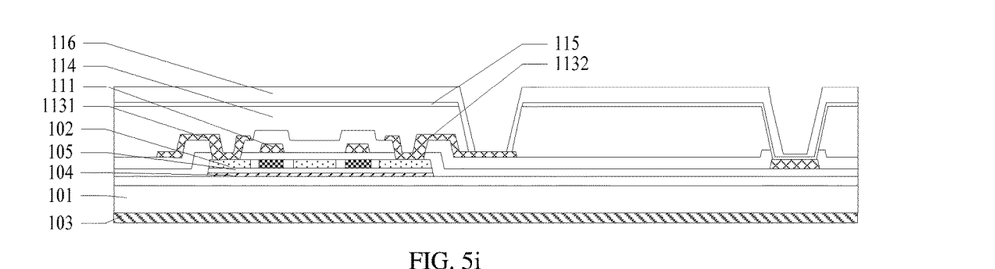

As illustrated in FIG. 5i, a via hole for exposing the drain electrode 1132 is formed by processing a passivation layer 116 with the passivation layer mask (Mask 7). The passivation layer can have a material of oxide, nitride, oxynitride, and the like, but the embodiment is not limited to this.

Figure 5J:
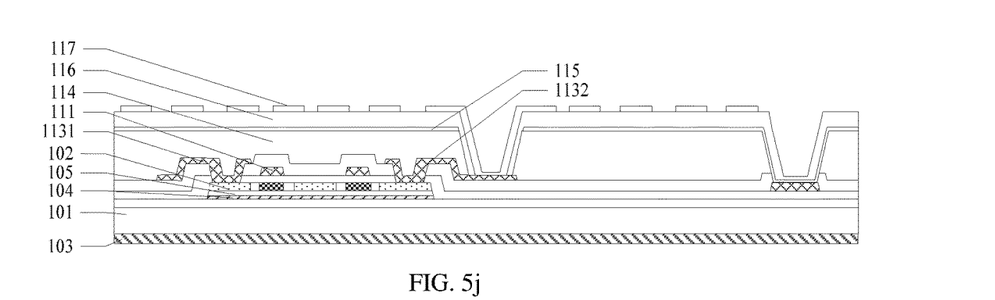

As illustrated in FIG. 5j, the pixel electrode 117 is formed by a patterning process with the pixel electrode mask (Mask 8), so that the pixel electrode 117 is electrically connected with the drain electrode 1132. A material of the pixel electrode 117 can be indium tin oxide and the like, but the embodiment is not limited to this.

It should be noted that, the above mentioned particular flows and structures are only some exemplary flows and structures according to the disclosure. Any other appropriate flows and structures can combine or substitute on a basis of utilizing the first polarization structure having the polarization characteristic. For example, as discussed in the first embodiment, in addition to the second polarization structure 103 being formed on the bottom surface of the base substrate 101, the second polarization structure 103 can be formed on the top surface of the base substrate 101. In this case, the manufacturing process is required to be changed correspondingly, which will not be repeated herein.

Fourth Embodiment

The embodiment provides a display panel. The display panel comprises an array substrate without a second polarization structure and the second polarization provided on a side of a base substrate far away from an active layer. A polarization direction of a first polarization structure is substantially perpendicular to a polarization direction of the second polarization structure, and both orthographic projections of the active layer and the first polarization structure on the base substrate fall within an orthographic projection of the second polarization structure on the base substrate.

The second polarization structure of the embodiment has the effect of a polarization plate of a conventional display panel close to a backlight. For example, the second polarization structure of the embodiment can be a polarization plate, and can also be a film layer having a nano-sized grating pattern which is similar to the first polarization structure. For example, the second polarization structure can be a metal wire grating structure.

For example, the second polarization structure of the embodiment adopting the metal wire grating structure can substitute a conventional process of attaching the polarization plate. Furthermore, a thickness of the second polarization plate adopting the metal wire grating structure can reach the nanometer level. Compared to the display panel comprising a conventional polarization plate, the display panel which adopts the second polarization structure to substitute the polarization plate has a smaller thickness.

Fifth Embodiment

The embodiment provides a display panel. The display panel comprises an array substrate provided with a second polarization structure, and the second polarization structure can substitute a polarization plate of the display panel close to a backlight, which saves a process of attaching the polarization plate.

For example, the second polarization structure of the embodiment can be a polarization plate, and can also be a film layer having a nano-sized grating pattern which is similar to the first polarization structure. For example, the second polarization structure can be a metal wire grating structure.

For example, when the second polarization structure of the embodiment adopts the metal wire grating structure, a thickness of the second polarization plate can reach the nanometer level. Compared to the display panel comprising a conventional polarization plate, the display panel which adopts the second polarization structure to substitute the polarization plate has a smaller thickness.

Sixth Embodiment

The embodiment provides a display device, comprising any one of the above mentioned array substrates. The display device which adopts the above mentioned array substrate illustrates an example in which the first polarization structure is provided between the base substrate and the active layer, for description. The first polarization structure can be prevented from causing the abnormal discharge phenomenon, and the cost is decreased and the yield rate is improved because the active layer and the first polarization structure are formed by one patterning process.

For example, the display device can be a liquid crystal display device, and the backlight is provided on a side of the base substrate far away from the active layer. But the embodiment is not limited to this, and the display device can also be an organic light emitting diode display device.

The following statements should be noted:

(1) Unless otherwise defined, the same reference sign represents the same meaning in the embodiments of the disclosure and accompanying drawings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed there between.

What are described above is the embodiments of the disclosure only and not limitative to the scope of the disclosure; any of those skilled in related arts can easily conceive variations and substitutions in the technical scopes disclosed by the disclosure, which should be encompassed in protection scopes of the disclosure. Therefore, the scopes of the disclosure should be defined in the appended claims.

The invention claimed is:

1. An array substrate, comprising:
   a base substrate;
   an active layer, disposed on the base substrate;
   a first polarization structure, disposed on a side of the active layer facing the base substrate, and an orthographic projection of the first polarization structure on the base substrate being at least partially overlapped with an orthographic projection of the active layer on the base substrate;
   a second polarization structure, laminated on the base substrate, and disposed on the side of the active layer facing the base substrate,
   wherein a polarization direction of the first polarization structure is substantially perpendicular to a polarization direction of the second polarization structure, and both of the orthographic projections of the active layer and the first polarization structure on the base substrate fall within an orthographic projection of the second polarization structure on the base substrate.

2. The array substrate of claim 1, wherein the first polarization structure is provided between the base substrate and the active layer.

3. The array substrate of claim 1, wherein the orthographic projection of the active layer on the base substrate falls within the orthographic projection of the first polarization structure on the base substrate.

4. The array substrate of claim 3, wherein the orthographic projection of the active layer on the base substrate substantially coincides with the orthographic projection of the first polarization structure on the base substrate.

5. The array substrate of claim 1, wherein a thickness of the first polarization structure is 50 Å-100 Å.

6. The array substrate of claim 1, wherein a material of the first polarization structure comprises metal or resin containing conductive material.

7. The array substrate of claim 1, wherein the first polarization structure has a nano-sized grating pattern.

8. The array substrate of claim 1, wherein the second polarization structure is provided between the base substrate and the active layer.

9. The array substrate of claim 1, wherein the second polarization structure has a nano-sized grating pattern.

10. The array substrate of claim 1, further comprising:
    a buffer layer, disposed between the first polarization structure and the active layer.

11. A manufacturing method of an array substrate, comprising:
    forming a polarization layer on a base substrate;
    forming a semiconductor layer on the base substrate;
    patterning the polarization layer and the semiconductor layer, the patterned semiconductor layer forming an active layer, the patterned polarization layer forming a first polarization structure, and an orthographic projection of the first polarization structure on the base substrate being at least partially overlapped with an orthographic projection of the active layer on the base substrate;
    forming a second polarization structure on a side of the active layer facing the base substrate,
    wherein a polarization direction of the first polarization structure is substantially perpendicular to a polarization direction of the second polarization structure, and both of the orthographic projections of the active layer and the first polarization structure on the base substrate fall within an orthographic projection of the second polarization structure on the base substrate.

12. The method of manufacturing the array substrate of claim 11, wherein the semiconductor layer is formed on a side of the polarization layer far away from the base substrate.

13. The manufacturing method of the array substrate of claim 12, wherein the polarization layer and the semiconductor layer are patterned by one patterning process.

14. The manufacturing method of the array substrate of claim 11, wherein a thickness of the first polarization structure is 50 Å-100 Å.

15. The manufacturing method of the array substrate of claim 11, wherein a material of the first polarization structure comprises metal or resin containing conductive material.

16. The manufacturing method of the array substrate of claim 11, wherein the first polarization structure has a nano-sized grating pattern.

17. The manufacturing method of the array substrate of claim 16, wherein the first polarization structure having the nano-sized grating pattern is formed by a nano-imprinting method.

18. The manufacturing method of the array substrate of claim 11, wherein the second polarization structure is formed between the active layer and the base substrate.

19. The manufacturing method of the array substrate of claim 11, wherein the second polarization is formed by a nano-imprinting method, and the second polarization structure has a nano-sized grating pattern.

20. A display panel, comprising the array substrate and a second polarization structure on the side of the active layer facing the base substrate,
  wherein the array substrate comprises:
  a base substrate;
  an active layer, disposed on the base substrate;
  a first polarization structure, disposed on a side of the active layer facing the base substrate, and an orthographic projection of the first polarization structure on the base substrate being at least partially overlapped with an orthographic projection of the active layer on the base substrate,
  wherein a polarization direction of the first polarization structure is substantially perpendicular to a polarization direction of the second polarization structure, and both of the orthographic projections of the active layer and the first polarization structure on the base substrate fall within an orthographic projection of the second polarization structure on the base substrate.

* * * * *